(12) United States Patent
Ickes

(10) Patent No.: US 6,617,866 B1
(45) Date of Patent: Sep. 9, 2003

(54) APPARATUS AND METHOD OF PROTECTING A PROBE CARD DURING A SORT SEQUENCE

(75) Inventor: Edward M. Ickes, Evans, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/921,028

(22) Filed: Aug. 2, 2001

(51) Int. Cl.⁷ ................................................ G01R 31/02
(52) U.S. Cl. ....................................................... 324/758
(58) Field of Search ........................... 438/17; 324/754, 324/758, 765

(56) References Cited

FOREIGN PATENT DOCUMENTS

JP          11-264839 A    *  9/1999   ........... H01L/21/66

\* cited by examiner

*Primary Examiner*—Evan Pert
(74) *Attorney, Agent, or Firm*—Carstens, Yee & Cahoon, LLP

(57) ABSTRACT

An apparatus and method for protecting a probe card during a sort sequence are provided. With the apparatus and method, one or more probe card protectors are attached to a probe card. When the wafer is driven toward the probe card, if an amount of overdriving of the probe card occurs, the probe card protectors come into contact with the wafer. By pressing against the wafer, the probe card protectors generate a force that causes a driver motor of the driving mechanism to stall, thereby avoiding any further overdrive of the probe card and avoiding damage to the probe card.

23 Claims, 4 Drawing Sheets

Probe card protectors, side view

Probe card protectors, bottom view

APPARATUS AND METHOD OF PROTECTING A PROBE CARD DURING A SORT SEQUENCE

BACKGROUND OF THE INVENTION

1. Technical Field

The present invention is directed to an improved apparatus and method for protecting a probe card during an integrated circuit wafer sort sequence.

2. Description of Related Art

Probe cards are often used during testing, or sorting, of integrated circuits on wafers. The probe card contains the circuitry and probe elements necessary to test for various characteristics of the integrated circuits. Probe cards generally come in a cantilever type probe card or a vertical probe card type. A cantilever type probe card has the probe pins arranged nearly horizontally with bends approaching 90 degrees at the wafer end to allow contact with the integrated circuit pads. Vertical probe cards have probe pins which are, as the name implies, vertical and are contained in alignment blocks.

When integrated circuits are initially fabricated they are in the form of a wafer. A wafer is a round disc of a very thin material, usually silicon. The sizes of these discs currently range from 4 to 12 inches in diameter. Many hundreds or even thousands of individual devices, called die, will fit onto each wafer. The circuitry is layered one layer at a time on this disc until the devices are built. During this process, contact pads are also built which provide places for the power to be applied and the signals to move to and from each device.

Once the fabrication process is complete, each die must be tested, or sorted, to ensure it functions prior to packaging it into its' final form, normally the black plastic devices we know as chips. In order to test the devices, the probe pins must be placed in contact with the contact pads on each device to allow the tester to power up the part and verify that it functions as desired. During sorting of the integrated circuit wafers, it is necessary to align the probe card with the integrated circuit wafer and bring the probes on the probe card into contact with the integrated circuit(s) on the wafer.

During this process, and sometimes during the actual testing process, a probe card is overdriven, meaning that the probe card is adversely driven into contact with the integrated circuit wafer or its' mounting surface thereby causing damage to the probe card. Such overdriving of the probe card may be the result of mechanical malfunctions in the driving mechanism and/or operator error.

Processes and procedures have been devised to try and avoid such destruction of probe cards. The processes required to set up and operate the equipment which sorts the wafers are covered in very specific, step by step procedures which follow a logical sequence designed to protect both the probe cards and the wafers from damage. For instance, procedures are in place which require that the system be reset to a safe condition each time a probe card is changed. The software which operates the equipment also has many safeguards in place which help prevent machine and operator error from causing damage. Unfortunately, all circumstances cannot be accounted for in software, and software does not always perform as intended. The probe cards are designed in view of these processes and procedures. However, even with these processes and procedures, situations arise and/or mistakes occur which still result in the destruction of probe cards. Therefore, it would be beneficial to have an apparatus and method for protecting probe cards during sort sequences which is comparatively foolproof with regard to the known procedures and processes.

SUMMARY OF THE INVENTION

The present invention provides an apparatus and method for protecting a probe card during a sort sequence. The present invention provides a plurality of physical blocks, which could be of any shape, hereafter referred to as probe card protectors, attached to a bottom, or probe side of a probe card.

The probe card protectors are machined to a height that is less than the height of the probe tip and a guard band. The degree to which the probe card protectors are shorter than the height of the probe tip and guard band may be set based on an amount of overdrive of the probe card that is deemed to be acceptable. The acceptable wear of the probe card must also be taken into account when deciding on a guard band height.

The guard band is equal to allowable overdrive plus acceptable wear (from a new probe card to a worn probe card is normally on the order of 10 mils) plus a small amount to allow for any number of variables which may include heat, adverse probe tip wear patterns, excessive force during normal probe sequence, etc. The idea of the guard band is to place the probe card protectors as close as possible to the probe tip height yet low enough so as to never impact normal probing.

The height of the probe tip is measured at its' lowest point where contact is made with the wafer contact pads, which corresponds to the probes farthest point from the bottom of the probe card. This height is hereafter referred to as probe card depth.

The probe card protectors are positioned on the probe card in positions where they will not interfere with the probe card docking mechanism, or prober, function. The prober is the name given to the equipment in which the probe card mounts and which manipulates the wafers in such a way as to position the probe tips into contact with the wafer contact pads, thereby allowing automated testing. The probe card protectors are machined from a base material that meets electrical and temperature requirements of probing.

During a sort sequence, if the probe card is overdriven due to mechanical or operator error, the probe card protectors of the present invention come into contact with the integrated circuit wafer after an acceptable amount of overdrive occurs. When the probe card protectors of the present invention contact the integrated circuit wafer, the contact action causes the z drive motor on the driving mechanism of the prober to stall, thereby stopping the driving of the probe card in the z direction. In this way, the driving of the probe card is stopped before damage to the probe card occurs.

Thus, the present invention provides a mechanical mechanism by which unacceptable overdrive of a probe card during a sort sequence or during the process of making the equipment ready to initiate a sort sequence is prevented. Because the solution of the present invention is of a mechanical nature rather than a procedural nature, the present invention operates to prevent damage to probe cards even in the presence of mechanical and/or operator error. Moreover, the present invention is relatively low cost compared to prior art software and sensor based approaches to solving the problem of probe cards being overdriven during sort sequences. These and other features of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
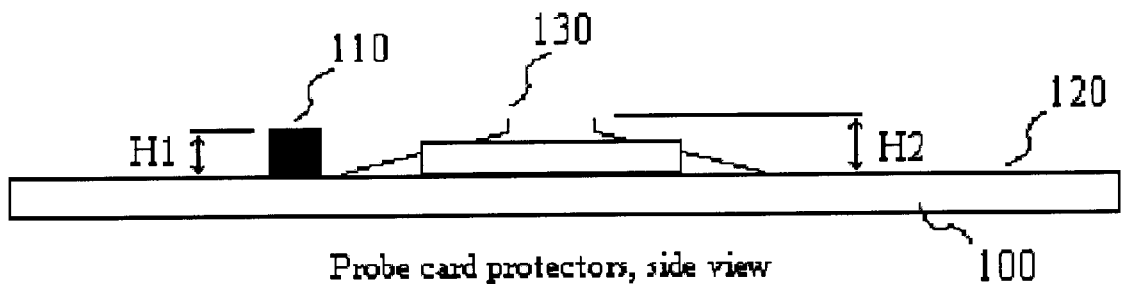
FIG. 1 is an exemplary diagram illustrating side view of a probe card according to the present invention.

FIG. 1 is an exemplary diagram illustrating a side view of a probe card according to the present invention. As shown in FIG. 1, one or more probe card protectors 110 are provided on a probe card 100. One probe card protector 110 is all that is needed to protect the probe card 100. However, in a preferred embodiment, a plurality of probe card protectors 110 are used because a plurality of probe card protectors 110 provide more surface area to more evenly distribute the force on the wafer when the probe card protectors 110 Contact the surface of the wafer. In addition, a plurality of probe card protectors 110 is preferred because there is a finite amount of force that is required to stall the z motor and the more probe card protectors 110 used, the sooner the stall force is reached thereby reducing the amount of overdrive on the probe card 100. The height H1 of the probe card protectors 110 is less than the height H2 of the probes 130 or possibly a combination of the height of the probes 130 and a height of a guard band.

In a preferred embodiment, the probe card protectors are machined from a Teflon base material although any base material that meets the electrical requirements and temperature requirements of probing may be used without departing from the spirit and scope of the present invention. Teflon was chosen due to its' electrical and mechanical characteristics and its' ability to withstand the temperatures and chemicals that it is subject to during the sorting sequence. In addition, Teflon is a relatively low cost of this material. Many other materials may be suitable base materials for the probe card protectors 110, such as Torlon or Vespel, but the cost of these materials may be prohibitive.

Also in a preferred embodiment, the probe card protectors are approximately 1 inch long, 1/8 of an inch wide and are machined to a height equal to the probe card depth minus 25 mils. The particular dimensions of the probe card protectors 110 set forth above in the preferred embodiment provide 10 mils of probe card wear, 5 mils of over travel, and a buffer of 10 mils.

In operation, during a sort sequence if there is mechanical or operator error, the probe card may be overdriven such that the probe tips and the probe card protectors of the present invention may contact the integrated circuit wafer. By virtue of the dimensions set forth above, the probe card protectors of the present invention will contact the top of the wafer after a maximum of 25 mils of overdrive. When the probe card protectors contact the top of the wafer, the z drive motorof the driving mechanism of the prober will stall thereby preventing any further overdrive of the probe card. In this way, damage to the probe card may be avoided Although the preferred embodiment uses the dimensions set forth above, any dimensions may be used that are deemed suitable to the specific circumstances. The only limitations on the selection of dimensions for the probe card protectors is that the height of the probe card protectors should be less than the height of the probe tips and the length and width of the probe card protectors should be selected so that the probe card protectors, when positioned appropriately, do not interfere with the docking mechanism or prober.

Figure 2:
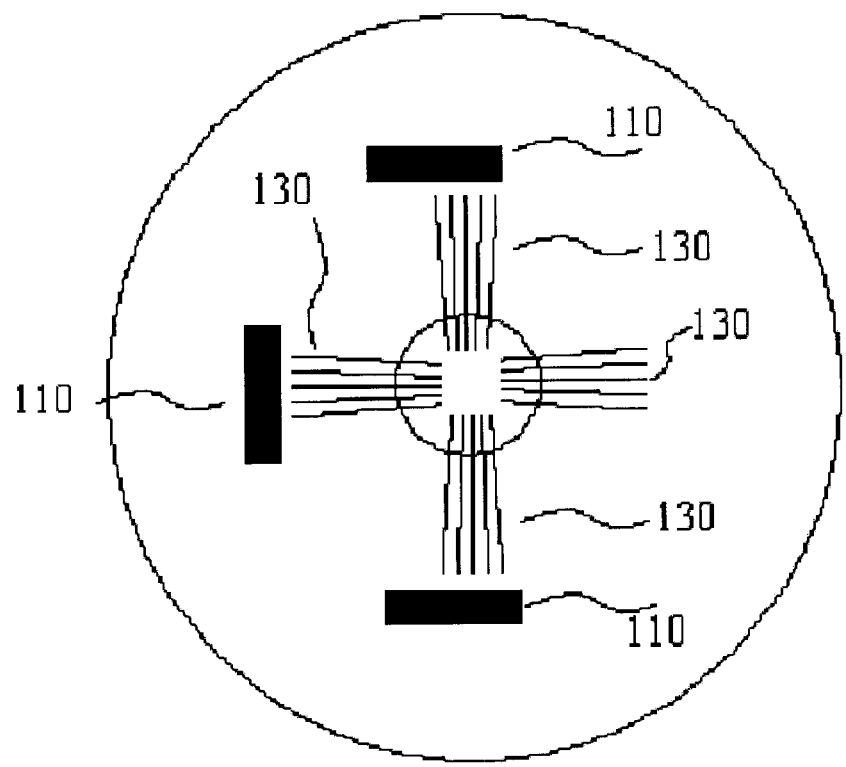
FIG. 2 is an exemplary diagram illustrating a top view of a probe card according to the present invention.

FIG. 2 is a top view of the probe side of a probe card in accordance with the present invention. As shown in FIG. 2, the plurality of probe card protectors 110 are positioned on the probe card in positions and orientations such that they do not interfere with the docking mechanism or prober.

The particular example shown in FIG. 2 illustrates the use of three probe card protectors although any number of probe card protectors may be used without departing from the spirit and scope of the present invention. In addition, while FIG. 2 shows an exemplary positioning and orientation of the probe card protectors, the invention is not limited to any such position or orientation.

Many different configurations of the probe card protectors may be used without departing from the spirit and scope of the present invention. For example, the probe card protectors may have different cross sectional shapes, different dimnensions, different positions and orientations, different base material structures, and the like, from the preferred embodiment described herein. In particular, the present invention is not limited to block-like probe card protectors. Rather, the probe card protectors may have a cross sectional shape that is rectangular, trapezoidal, circular, semi-circular, triangular, pyramidal, and the like.

All of the possible configurations cannot be described herein due to the large number of options. However, it should be noted that the only limitations on the configurations of the probe card protectors are that 1) the height of the probe card protectors should be less than the height of the probe tips, 2) the probe card protectors should be positioned such that they do not interfere with the docking mechanism or prober, and 3) the base material should meet the electrical requirements and temperature requirements of the probing operation. Beyond these limitations, the probe card protectors may take any configuration deemed suitable to the specific purpose for which they are used.

Figure 3:
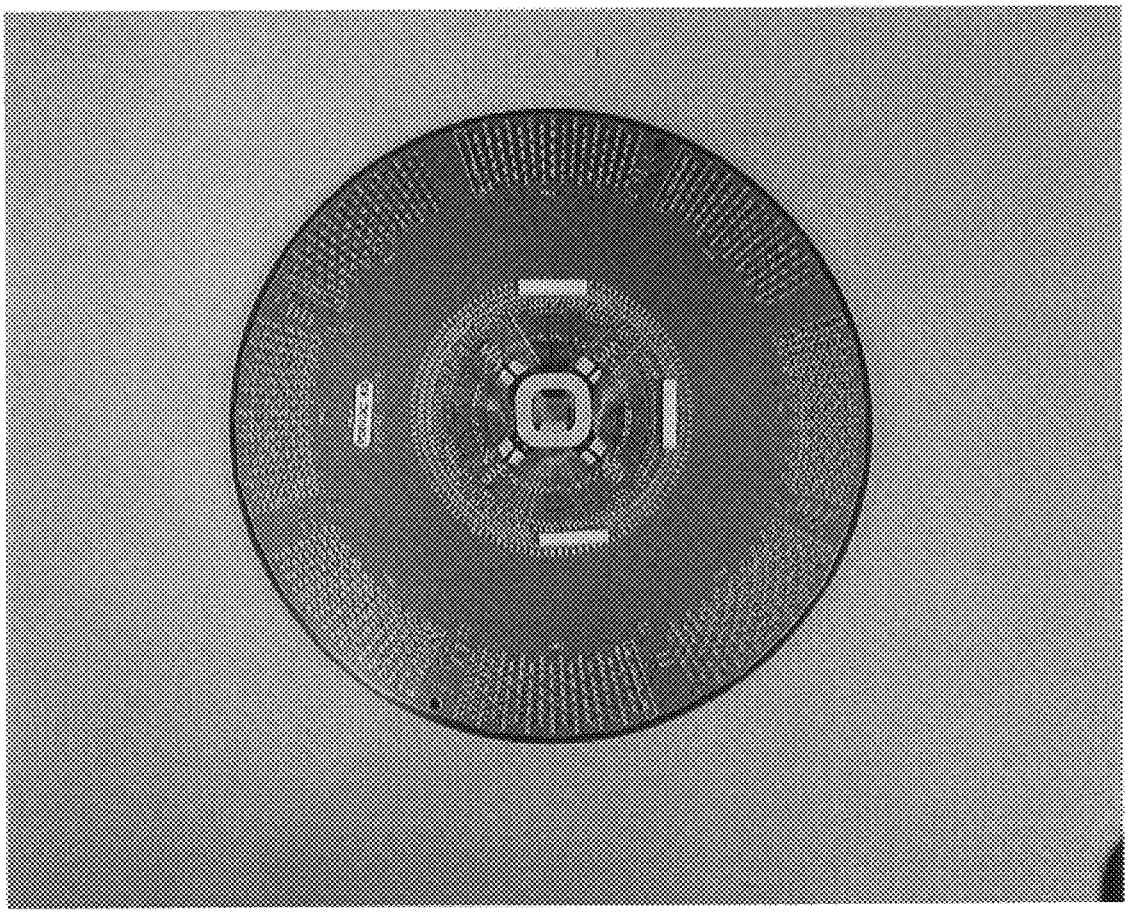
FIG. 3 is a photograph of a probe side of a probe card according to the present invention.
Figure 4:
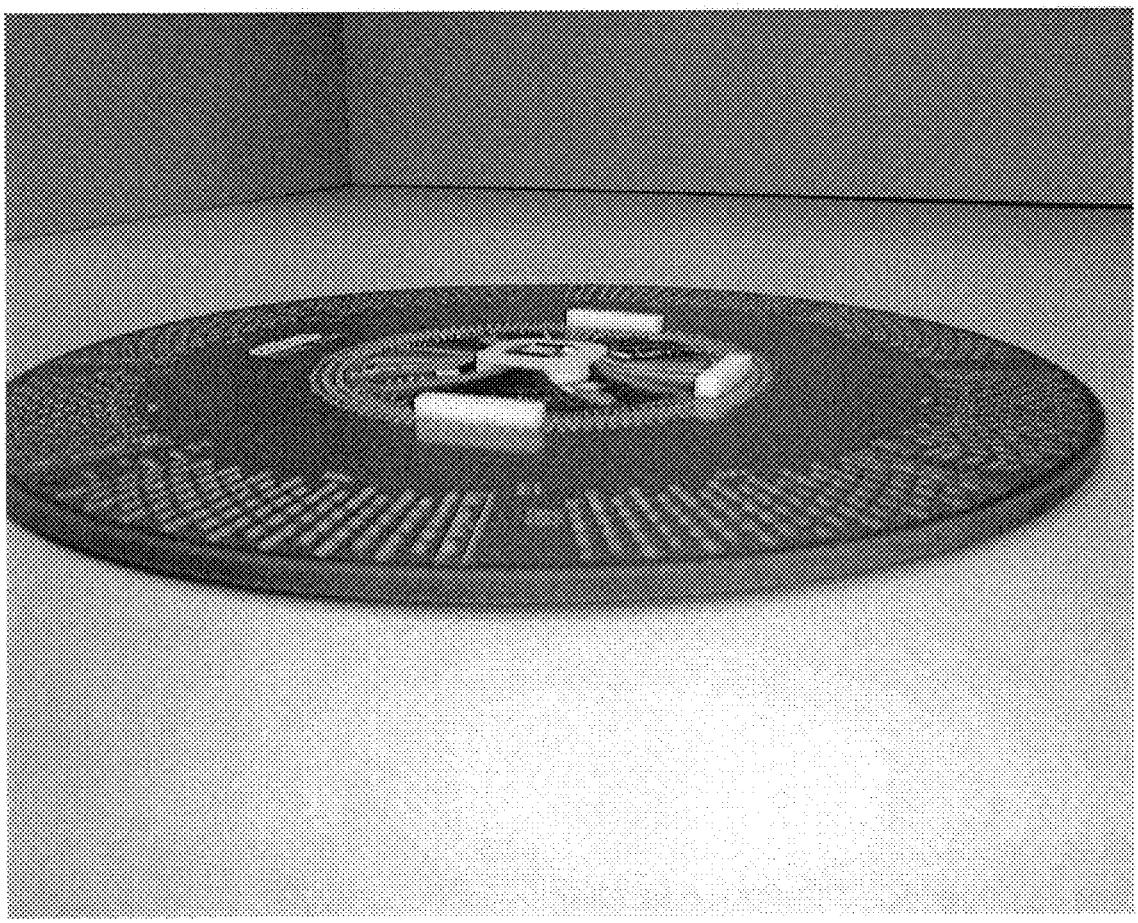
FIG. 4 is a photograph of a probe side of a probe card according to the present invention from an isometric view.
Figure 5:
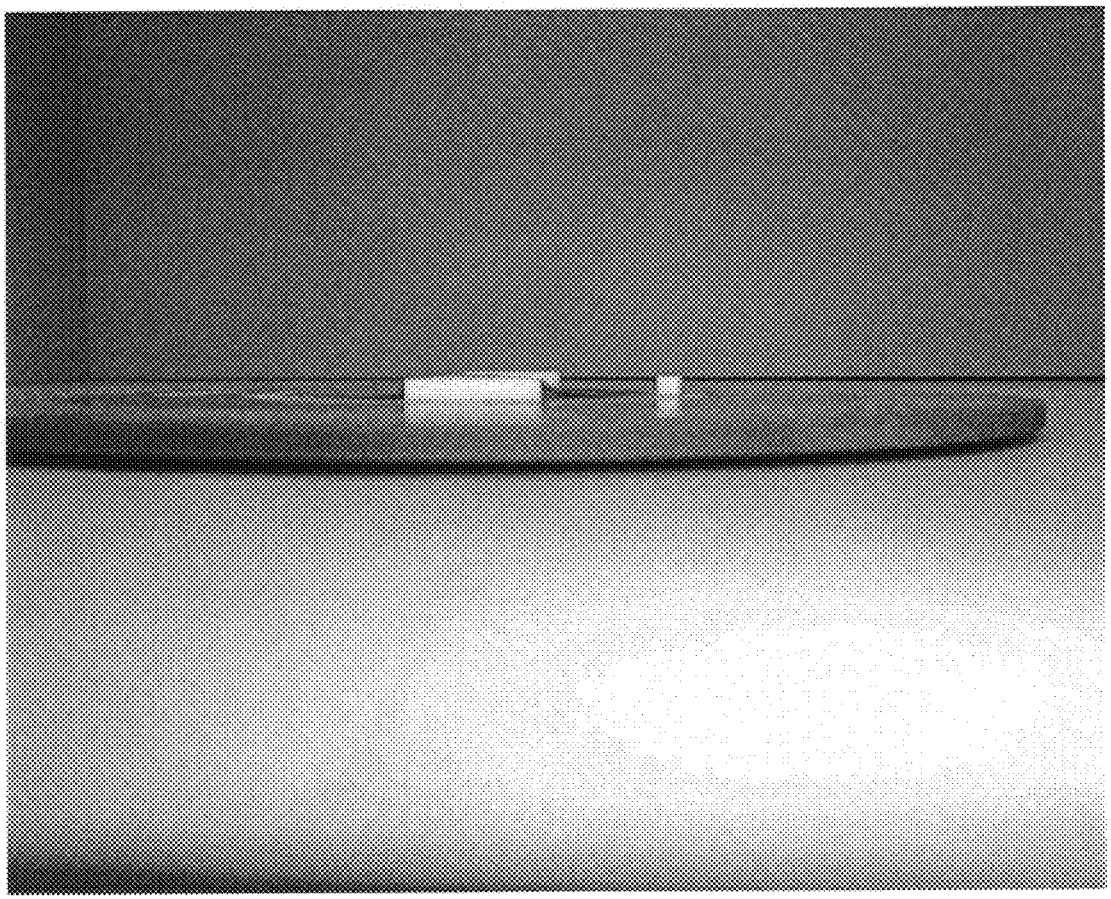
FIG. 5 is a photograph of a probe side of a probe card according to the present invention from a side view.

FIGS. 3–5 are photographs of an exemplary probe card according to the present invention. The photographs shown in FIGS. 3–5 show various views of the probe card. The probe card shown in these figures corresponds to the exemplary diagrams in FIGS. 1–2.

Thus, the present invention provides a mechanical mechanism for preventing damage to probe cards due to overdriving the probe card during a sort sequence. The mechanical mechanism of the present invention is relatively low cost compared to software and sensor based methods used in the prior art to address the problem of overdriving probe cards during sort sequences. In addition, because the present invention provides a mechanical solution, the present invention is not susceptible to computer system or human operator errors and thus, provides a foolproof solution to preventing damage to probe cards during sort sequences.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus, conmprising:

a probe card; and a least on one probe card protector attached to a side of the probe card, wherein the at least one probe card protector is configureded to prevent unacceptable overdrive of the probe card relative to a wafer, and wherein the at least one probe card protector inhibits an amount of overdrive of the wafer toward the probe card by pressing against the wafer to thereby stall a driving motor driving the probe card toward the wafer.

2. The apparatus of claim 1, wherein the probe card comprises at least one probe, and wherein the at least one probe card protector has a height less than a height of a tip of the at least one probe.

3. The apparatus of claim 1, wherein the at least one probe card protector is positioned such that the at least one probe card protector does not interfere with a docking mechanism.

4. The apparatuses of claim 1, wherein the at least one probe card protector is machined from a base material that meets at least one of electrical requirements and temperature requirements of a probing operation.

5. The apparatus of claim 1, wherein the at least one probe card protector has a height equal to a probe card depth minus 25 mils.

6. The apparatus of claim 5, wherein the at least one probe card protector has a lenglh of 1 inch and a width of ⅛ of an inch.

7. The apparatus of claim 1, wherein the at least one probe card protector has a height that allows at least one of 10 mils of probe card wear and 5 mils of over travel of probe card drive relative to a wafer.

8. The apparatus of claim 1, wherein the at lest one probe card protector has one of a rectangular, a trapezoidal, a circular, a semi-circular, triangular, and a pyramidal cross sectional shape.

9. The apparatus of claim 1, wherein the at least one probe card protector is a Teflon block.

10. The apparatus of claim 1, wherein the at least one probe card protector comprises three probe card protectors attached to a probe side of the probe card.

11. A method or making a probe card, comprising:

providing probe card;

providing at least one probe card protector; and attaching the at least one probe card protector to a probe side of the probe card, wherein the at least one probe card protectors is configured to prevent unacceptable overdrive of the probe card relative to a wafer, and wherein the at least one probe card protector inhibits an amount of overdrive of the wafer toward the probe card by pressing against the wafer to thereby stall a driving motor of driving the probe card toward the wafer.

12. The method of claim 11, wherein the probe card comprises at least one probe, and wherein the at least one probe card protector has a height less than a height of a tip of the at least one probe.

13. The method of claim 11, wherein the at last one probe card protector is positioned such that the at least one probe card protector does not interfere with a docking mechanism.

14. The method of claim 11, wherein the at least one probe card protector is machined from a base material that meets at least one of electrical requirements and temperature requirements of a probing operation.

15. The method of claim 11, wherein the at least one probe card protector has height equal to a probe card depth minus 25 mils.

16. The method of claim 15, wherein the at least one probe card protector has a length of 1 inch and a with of ⅛ of an inch.

17. The method of claim 11, wherein the at least one probe card protector has a height that allows at least one of 10 mils of probe card wear and 5 mils of over travel of a probe card drive relative to a wafer.

18. The method of claim 11, wherein the at least one probe card protector has one of a rectangular, a trapezoidal, a circular, a semi-circular, a triangular, and a pyramidal cross sectional shape.

19. The method of claim 11, wherein the least one probe card protector is a Teflon block.

20. The method of claim 11, wherein the at least one probe card protector comprises three probe card protectors attached to a probe side of the probe card.

21. A method of protecting a probe card during a sort sequence, comprising:

driving the probe card toward a wafer; and inhibiting an amount of overdrive of the wafer toward the probe card using at least one probe card protector attached to the probe card, wherein the at least one probe card protector inhibits an amount of overdrive of the wafer toward the probe card by pressing against the wafer to thereby stall a driving motor driving the probe card toward the wafer.

22. The method of claim 21, wherein the probe card comprises at least one probe, and wherein the at least one probe card protector has a height less than a height of tip of the at least one probe.

23. The method of claim 21, wherein the amount of overdrive that is inhibited is an amount of overdrive greater than 25 mils.

* * * * *